United States Patent
Toriyama et al.

(10) Patent No.: US 12,283,593 B2
(45) Date of Patent: Apr. 22, 2025

(54) SEMICONDUCTOR DEVICE

(71) Applicant: DENSO CORPORATION, Kariya (JP)

(72) Inventors: Shuichi Toriyama, Kariya (JP); Masakiyo Sumitomo, Kariya (JP); Tasbir Rahman, Toyota (JP)

(73) Assignee: DENSO CORPORATION, Kariya (JP)

( * ) Notice: Subject to any disclaimer, the term of this patent is extended or adjusted under 35 U.S.C. 154(b) by 429 days.

(21) Appl. No.: 17/903,113

(22) Filed: Sep. 6, 2022

(65) Prior Publication Data
US 2022/0415884 A1  Dec. 29, 2022

Related U.S. Application Data

(63) Continuation of application No. PCT/JP2021/008803, filed on Mar. 5, 2021.

(30) Foreign Application Priority Data

Mar. 10, 2020  (JP) ................................. 2020-041275

(51) Int. Cl.
*H01L 27/06* (2006.01)
*H01L 29/739* (2006.01)
*H01L 29/872* (2006.01)

(52) U.S. Cl.
CPC ...... *H01L 27/0664* (2013.01); *H01L 29/7397* (2013.01); *H01L 29/872* (2013.01)

(58) Field of Classification Search
CPC ............... H01L 27/0664; H01L 29/872; H01L 29/7397; H01L 29/0696; H01L 29/0623; H01L 29/0834; H01L 29/66477; H01L 29/78
See application file for complete search history.

(56) References Cited

U.S. PATENT DOCUMENTS

| | | |
|---|---|---|
| 2005/0045960 A1 | 3/2005 | Takahashi |
| 2007/0069287 A1 | 3/2007 | Takahashi |
| 2007/0170549 A1 | 7/2007 | Tsuzuki et al. |
| 2021/0050345 A1* | 2/2021 | Tamura ............ H01L 21/28537 |

* cited by examiner

Primary Examiner — Tucker J Wright
(74) Attorney, Agent, or Firm — Posz Law Group, PLC

(57) ABSTRACT

A semiconductor device includes a semiconductor substrate, a contact region, a carrier suppression region and an electrode. The semiconductor substrate is shared by an insulated gate bipolar transistor (IGBT) region with an IGBT element and a freewheeling diode (FWD) region with an FWD element. The carrier suppression region is exposed from a surface of the semiconductor substrate in the IGBT region, and has a lower impurity concentration than the contact region. The carrier suppression region has a Schottky barrier junction with the electrode.

5 Claims, 12 Drawing Sheets

SEMICONDUCTOR DEVICE

CROSS REFERENCE TO RELATED APPLICATIONS

The present application is a continuation application of International Patent Application No. PCT/JP2021/008803 filed on Mar. 5, 2021, which designated the U.S. and claims the benefit of priority from Japanese Patent Application No. 2020-41275 filed on Mar. 10, 2020. The entire disclosures of all of the above applications are incorporated herein by reference.

TECHNICAL FIELD

The present disclosure relates to a semiconductor device.

BACKGROUND

A semiconductor device may have an insulated gate bipolar transistor (IGBT) element having an insulated gate structure and a freewheeling diode (FWD) element formed at a shared semiconductor substrate.

SUMMARY

The present disclosure describes a semiconductor device including a semiconductor substrate, a contact region, electrodes and a carrier suppression region.

BRIEF DESCRIPTION OF DRAWINGS

Objects, features and advantages of the present disclosure will become more apparent from the following detailed description made with reference to the accompanying drawings. In the drawings:

FIG. 4A illustrates a simulation result related to electron concentration in a state where an FWD element in the semiconductor device without formation of the hole suppression region is turned on;

FIG. 4B illustrates a simulation result related to electron concentration in a state where the FWD element in the semiconductor device with the hole suppression region having a length of 0.7 micrometer (μm) is turned on;

FIG. 4C illustrates a simulation result related to electron concentration in a state where the FWD element in the semiconductor device with the hole suppression region having an ultimate length is turned on;

FIG. 5 illustrates electron concentration in a state where the FWD element is turned on;

DETAILED DESCRIPTION

Figure 1:
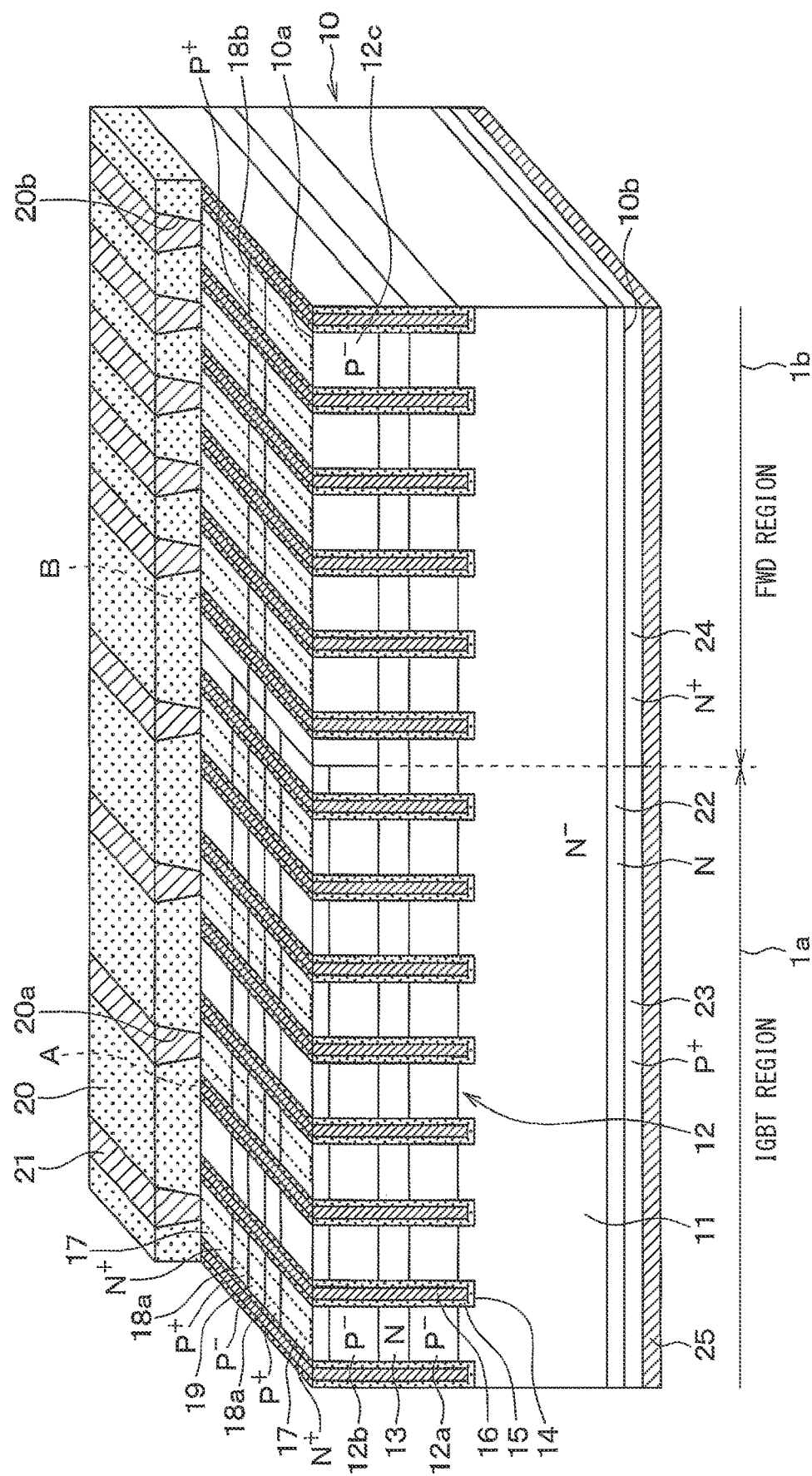
FIG. 1 illustrates a perspective cross-sectional view of a semiconductor device according to a first embodiment.

A semiconductor device may have an IGBT region with an IGBT element and an FWD region with an FWD element formed at a shared semiconductor substrate. The semiconductor device may be adopted as a switching element in, for example, an inverter. In the semiconductor device, a base layer may be formed at a side closer to a surface of the semiconductor substrate for forming an $N^-$-type drift layer, and multiple trenches are provided so as to penetrate through the base layer of the semiconductor substrate. Each of the trenches extends in a lengthwise direction parallel to the surface of the semiconductor substrate. In each of the trenches, a gate insulation film and a gate electrode are formed in a stated order.

At the surface layer portion of the base layer, $N^+$-type emitter regions are respectively formed to be in contact with the trenches, and $P^+$-type contact regions are respectively formed to have higher impurity concentrations than the base layer. A $P^+$-type collector layer and an $N^+$-type cathode layer are formed at a side closer to another surface of the semiconductor substrate. In this semiconductor device, a trench contact is formed between the adjacent trenches to penetrate the emitter region and the contact region to reach the base layer at a side closer to the surface of the semiconductor substrate.

An upper electrode is embedded in the trench contact to be electrically connected to the emitter region, the contact region and the base layer at a side closer to the surface of the semiconductor substrate. A lower electrode electrically connected to the collector layer and the cathode layer is formed at a side closer to the other surface of the semiconductor substrate.

In such a semiconductor device, a region in which the collector layer is formed at the side closer to the other surface of the semiconductor substrate is referred to as the IGBT region, and a region in which the cathode layer is formed is referred to as the FWD region. In the FWD region, since the above configuration is employed, the FWD element having a PN junction is formed by the N-type cathode layer, the N-type drift layer, and the P-type base layer.

In the above semiconductor device, when the FWD element is turned on to have a diode operation, the upper electrode is also connected to the base layer and the injection of the holes is suppressed, as compared with a case in which the upper electrode is only connected to the emitter region and the contact region. Therefore, when the FWD element is in a recovery state, it is possible to suppress a recovery current and reduce recovery loss.

However, in the above-mentioned semiconductor device, it may be difficult to narrow the distance between the adjacent trenches as the trench contact is formed between the adjacent trenches. As a result, an on-state voltage may rise during the operation of the IGBT element in the above-mentioned semiconductor device.

According to an aspect of the present disclosure, a semiconductor device has a semiconductor substrate, trenches, a gate insulation film, a gate electrode, an emitter region, a contact region, a first electrode, a second electrode, and a carrier suppression region. The semiconductor substrate is shared by an IGBT region with an IGBT element and an FWD region with an FWD element. The semiconductor substrate includes a drift layer, a base layer, a collector layer and a cathode layer. The drift layer is a first conductivity type. The base layer is a second conductivity type, and is disposed on the drift layer. The collector layer is the second conductivity type, and is disposed at an opposite side of the drift layer from the base layer in the IGBT region. The cathode layer is the first conductivity type, and is disposed at the opposite side of the drift layer from the base layer in the FWD region. The gate insulation film is disposed at a wall surface of each of trenches in the IGBT region. Each of the trenches penetrates the base layer to reach the drift layer, and each of the trenches having a lengthwise direction and extending in the lengthwise direction. The gate electrode is disposed on the gate insulation film. The emitter region is the first conductivity type, and is a surface layer portion of the base layer that is in contact with each of the trenches in the IGBT region. The emitter region has a higher impurity concentration than the drift layer. The contact region is the second conductivity type, and is disposed at the surface layer portion of the base layer in the IGBT region. The contact region has a higher impurity concentration than the base layer. The first electrode is disposed at a first surface of the semiconductor substrate at a side closer to the base layer, and the first electrode is electrically connected to the base layer and the emitter region. The second electrode is disposed at a second surface of the semiconductor substrate at a side closer to the collector layer and the cathode layer, and the second electrode is electrically connected to the collector layer and the cathode layer. The carrier suppression region is the second conductivity type, and is exposed from the first surface of the substrate in the IGBT region. The carrier suppression region has a lower impurity concentration than the contact region. The first electrode has a Schottky barrier junction with the carrier suppression region.

According to the above structure, the carrier suppression region exposed from the first surface of the semiconductor substrate is disposed, and the first electrode has the Schottky barrier junction with the carrier suppression region. Therefore, when the FWD element is in an ON-state, it is possible to suppress the injection of the carriers from the first electrode to the surface layer portion in the IGBT region. As a result, it is possible to reduce the recovery current and the recovery loss.

Since the carrier suppression region is exposed from the first surface of the semiconductor substrate, it is not required to form the trench contact for connecting the carrier suppression region and the upper electrode. As a result, it is possible to narrow the distance between the adjacent trenches, and it is possible to suppress a rise in the on-state voltage of the IGBT element.

The following describes multiple embodiments with reference to the drawings. Hereinafter, in the respective embodiments, substantially the same configurations are denoted by identical symbols, and repetitive description will be omitted.

First Embodiment

A first embodiment will be described with reference to the drawings. A semiconductor device according to the present embodiment may be adopted as a power switching element used in power supply circuits such as inverters and DC/DC converters.

As illustrated in FIG. 1, the semiconductor device according to the present embodiment has a Reverse Conducting-IGBT (RC-IGBT) in which an IGBT region 1a having an IGBT element and an FWD region 1b having an FWD element are formed at a shared semiconductor substrate 10. In the present embodiment, a portion on a collector layer 23 described hereinafter is set as the IGBT region 1a, and a portion on a cathode layer 24 described hereinafter is set as the FWD region 1b.

The semiconductor device has the semiconductor substrate 10 for forming an N$^-$-type drift layer 11. In the present embodiment, the semiconductor substrate 10 is made of a silicon substrate, and has a thickness of about 110 μm. A base layer 12 is formed on the drift layer 11. In other words, the base layer 12 is formed at a side closer to a first surface 10a of the semiconductor substrate 10.

The base layer 12 according to the present embodiment includes a lower base layer 12a, a first upper base layer 12b and a second upper base layer 12c. The lower base layer 12a is P$^-$-type, and is disposed on the drift layer 11. A carrier storage (CS) layer 13 is formed on the lower base layer 12a, and has a higher impurity concentration than the drift layer 11. The lower base layer 12a and the CS layer 13 are formed at the IGBT region 1a and the FWD region 1b.

The first upper base layer 12b is arranged at the IGBT region 1a on the CS layer 13, and has a higher impurity concentration than the lower base layer 12a. The second upper base layer 12c is arranged at the FWD region 1b on the CS layer 13, and has a lower impurity concentration than the lower base layer 12a.

In other words, the base layer 12 according to the present embodiment are divided into the lower base layer 12a, the first upper base layer 12b and the second upper base layer 12c through the CS layer 13. The lower base layer 12a is located at a side closer to the drift layer 11, and the first upper base layer 12b and the second upper base layer 12c are located at a side closer to the first surface 10a of the semiconductor substrate 10. In the present embodiment, the first upper base layer 12b and the second upper base layer 12c are divided by the boundary between the IGBT region 1a and the FWD region 1b.

The impurity concentration of the lower base layer 12a is set based on the required breakdown voltage, and is, for example, about $5.0 \times 10^{16}$ cm$^{-3}$. The impurity concentration of the first upper base layer 12b is set based on the required threshold voltage Vth in the insulated gate structure described later, and is, for example, about 1.0 to $3.0 \times 10^{17}$ cm$^{-3}$. The impurity concentration of the second upper base layer 12c is set based on the forward voltage Vf when the required FWD element is in the ON-state, and is set to, for example, about $2.0 \times 10^{16}$ cm$^{-3}$. In other words, in the present embodiment, the lower base layer 12a, the first upper base layer 12b and the second upper base layer 12c respectively have different impurity concentrations to satisfy the required condition. The second upper base layer 12c is set based on a forward voltage Vf when the FWD element is in the ON-state, and is set in consideration of the impurity concentration and area of a second contact region 18b.

Multiple trenches 14 are formed at the semiconductor substrate 10 so as to penetrate from the first surface 10a through the base layer 12 and the CS layer 13 to reach the drift layer 11. Accordingly, the base layer 12 and the CS layer 13 are divided into multiple pieces by the trenches 14. In the present embodiment, the trenches 14 are respectively formed at the IGBT region 1a and the FWD region 1b. The depth of each of the trenches 14 from the first surface 10a of the semiconductor substrate 10 is about 5 μm. In the present embodiment, the trenches 14 are formed in a striped shape having a lengthwise direction intersecting an aligned direction of the IGBT region 1a and the FWD region 1b.

Each of the trenches 14 is filled with a gate insulation film 15 formed so as to cover a wall surface of each of the trenches 14, and a gate electrode 16 made of polysilicon or the like formed on the gate insulation film 15. Accordingly, a trench gate structure is formed.

An N$^+$-type emitter region 17 having a higher impurity concentration than the drift layer 11 and a P$^+$-type first contact region 18a having a higher impurity concentration than the first upper base layer 12b are separately formed in the surface portion of the base layer 12 in the IGBT region 1a.

Figure 2:
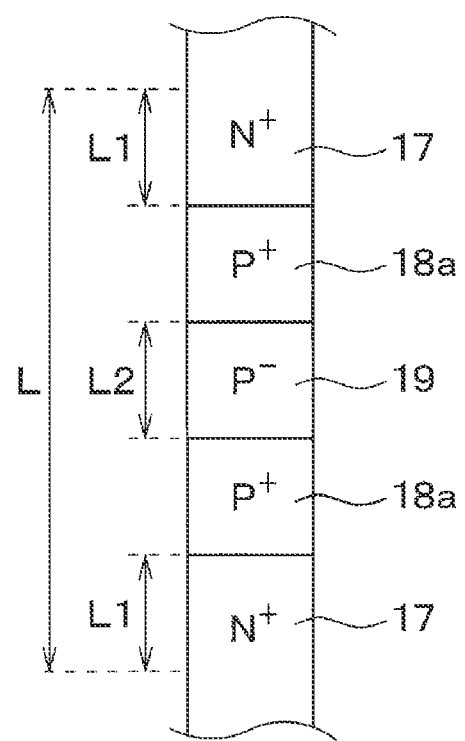
FIG. 2 illustrates a plan view of a section between adjacent trenches at a surface of a semiconductor substrate.

The emitter region 17 and the first contact region 18a are formed to be exposed from the first surface 10a of the semiconductor substrate 10. In the present embodiment, as illustrated in FIGS. 1, 2, the emitter region 17 and the first contact region 18a are formed alternately in the lengthwise direction of each of the trenches 14, and formed to be in contact with the adjacent trenches 14.

A hole suppression region 19 exposed from the first surface 10a of the semiconductor substrate 10 inside the first contact region 18a. The hole suppression region 19 is formed at a side closer to the first surface 10a of the semiconductor substrate 10 to be separated from the emitter region 17. The hole suppression region 19 has a lower impurity concentration than the first contact region 18a, and the first upper base layer 12b is exposed from the semiconductor substrate 10 in the present embodiment. In other words, the hole suppression region 19 according to the present embodiment has a portion of the first upper base layer 12b. In the present embodiment, the hole suppression region 19 corresponds to a carrier suppression region.

The P$^+$-type second contact region 18b is formed at the surface layer portion of the second upper base layer 12c at the FWD region 1b, and has higher impurity concentration than the second upper base layer 12c.

Although not particularly limited, each of the first contact region 18a and the second contact region 18b has an impurity concentration of about $1.0 \times 10^{18}$ to $5.0 \times 10^{19}$ cm$^{-3}$.

On the first surface 10a of the semiconductor substrate 30, an interlayer insulation film 20 made of borophosphosilicate glass(BPSG) or the like is formed. A first contact hole 20a is formed at the interlayer insulation film 20. The first contact hole 20a exposes the emitter region 17, the first contact region 18a, the hole suppression region 19 located between the adjacent trenches 14 at the first surface 10a of the semiconductor substrate 10 in the IGBT region 1a. A second contact hole 20b is formed at the interlayer insulation film 20. The second contact hole 20b exposes the second upper base layer 12c and the second contact region 18b at the first surface 10a of the semiconductor substrate 10 in the FWD region 1b.

In the present embodiment, the first contact hole 20a and the second contact hole 20b extend in the lengthwise direction of the trench 14. The first contact hole 20a is formed to expose the portion between the adjacent trenches 14 alternately in a direction perpendicular to the lengthwise direction of the trench 14 as a direction parallel to the first surface 10a of the semiconductor substrate 10. That is, the IGBT element according to the present embodiment has a thinning structure. In the following, the direction parallel to the plane of the first surface 10a of the semiconductor substrate 10 may also be simply referred to the direction perpendicular to the lengthwise direction of the trench 14.

FIG. 1 omits a portion of each of the interlayer insulation film 20 and an upper electrode 21 for easily illustrating the structure at a side closer to the first surface 10a of the semiconductor substrate 10. FIG. 1 illustrates a region exposed from the first contact hole 20a as a region A with a dotted line, and further illustrates a region exposed from the second contact hole 20b as a region B with a dotted line.

The upper electrode 21 is formed on the interlayer insulation film 20. The upper electrode 21 is electrically connected to have an ohmic contact with the emitter region 17 and the first contact region 18a through the first contact hole 20a formed at the interlayer insulation film 20. The upper electrode 21 is electrically connected to have a Schottky barrier junction with the hole suppression region 19 through the first contact hole 20a formed at the interlayer insulation film 20. A P-type Schottky barrier diode (SBD) having the hole suppression region 19 and the upper electrode 21 is formed at the IGBT region 1a.

The upper electrode 21 is electrically connected to the second upper base layer 12c and the second contact region 18b through the second contact hole 20b formed at the interlayer insulation film 20.

That is, on the interlayer insulation film 20, the upper electrode 21 that functions as an emitter electrode in the IGBT region 1a and functions as an anode electrode in the FWD region 1b is formed. In the present embodiment, the upper electrode 21 corresponds to the first electrode. In the present embodiment, the upper electrode 21 is made of titanium silicide or the like having a Schottky barrier height φB of about 0.61 electron volt (eV) with respect to silicon assumed as the semiconductor substrate 10.

An N-type field stop (FS) layer 22 having an impurity concentration higher than the drift layer 11 is formed on a side of the drift layer 11 facing the base layer 12. In other words, the FS layer 22 is formed at a side closer to a second surface 10b of the semiconductor substrate 10.

In the IGBT region 1a, the P$^+$-type collector layer 23 is formed at a side facing the drift layer 11 across the FS layer 22, and in the FWD region 1b, the N$^+$-type cathode layer 24 is formed at a side facing the drift layer 11 across the FS layer 22. In other words, the collector layer 23 and the cathode layer 24 are formed adjacent to each other at a side opposite to the drift layer 11 across the FS layer 22. The IGBT region 1a and the FWD region 1b are divided depending on whether a layer formed at a side closer to the second surface 10b of the semiconductor substrate 10 is the collector layer 23 or the cathode layer 24. In other words, in the present embodiment, the portion on the collector layer 23 is the IGBT region 1a, and the portion on the cathode layer 24 is the FWD region 1b.

At the side facing the drift layer 11 across the collector layer 23 and the cathode layer 24, a lower electrode 25 is formed to be electrically connected to the collector layer 23 and the cathode layer 24. In other words, the lower electrode 25 functioning as a collector electrode in the IGBT region 1a and a cathode electrode in the FWD region 1b is formed. In the present embodiment, the lower electrode 25 corresponds to a second electrode.

The semiconductor device according to the present embodiment includes the IGBT element in the IGBT region 1a. The IGBT element includes the base layer 12 as a base of the IGBT element, the emitter region 17 as an emitter of the IGBT element, and the collector layer 23 as a collector of the IGBT element. The semiconductor device according to the present embodiment also includes the FWD element in the FWD region 1b. The PN jointed FWD element includes a base layer as the anode, and further includes the drift layer 11, the FS layer 22 and the cathode layer 24 as the cathode.

The structure of the semiconductor device according to the present embodiment has been described above. In the present embodiment, the IGBT region 1a and the FWD region 1b are formed on the shared semiconductor substrate 10 in this manner. In the present embodiment, the N-type, the N+-type, and the N−-type correspond to a first conductive type, and the P-type and P+-type correspond to a second conductive type. According to the above-mentioned structure, the semiconductor substrate 10 includes the drift layer 11, the base layer 12, the CS layer 13, the emitter region 17, the first contact region 18a, the second contact region 18b, the hole suppression region 19, the FS layer 22, the collector layer 23 and the cathode layer 24.

The following describes the operation and advantageous effects of the semiconductor device.

First, in the semiconductor device, when a voltage higher than that of the upper electrode 21 is applied to the lower electrode 25, the PN junction formed between the base layer 12 and the drift layer 11 is brought into a reverse conduction state to form a depletion layer. When a low-level voltage (for example, 0 V) that is less than a threshold voltage Vth of the insulated gate structure is applied to the gate electrode 16, a current does not flow between the upper electrode 21 and the lower electrode 25.

In order to turn the IGBT element to the ON-state, a high-level voltage, which is equal to or higher than the threshold voltage Vth of the insulated gate structure, is applied to the gate electrode 16 in a state where a voltage higher than that of the upper electrode 21 is applied to the lower electrode 25. As a result, an inversion layer is formed in a portion of the base layer 12 which is in contact with each of the trenches 14 in which the gate electrode 16 is disposed. Each IGBT element is turned to the ON-state by supplying electrons from the emitter region 17 to the drift layer 11 through the inversion layer, thereby supplying holes from the collector layer 23 to the drift layer 11, and decreasing the resistance value of the drift layer 11 by the conductivity modulation.

When the IGBT element is turned to OFF-state and the FWD element is turned to the ON-state (that is, the FWD element is operated as a diode), the voltage to be applied to the upper electrode 21 and the lower electrode 25 is switched, and a voltage higher than that applied to the lower electrode 25 is applied to the upper electrode 21. As a result, the FWD element operates as a diode by supplying holes to the base layer 12 and supplying electrons to the cathode layer 24.

At this time, in the present embodiment, the hole suppression region 19 is formed at the IGBT region 1a. The hole suppression region 19 and the upper electrode 21 have a Schottky barrier junction to form the SBD. Therefore, when the FWD element is at the ON-state, it is possible to suppress the supply of the holes to the second upper base layer 12c in the IGBT region 1a.

Figure 3A:
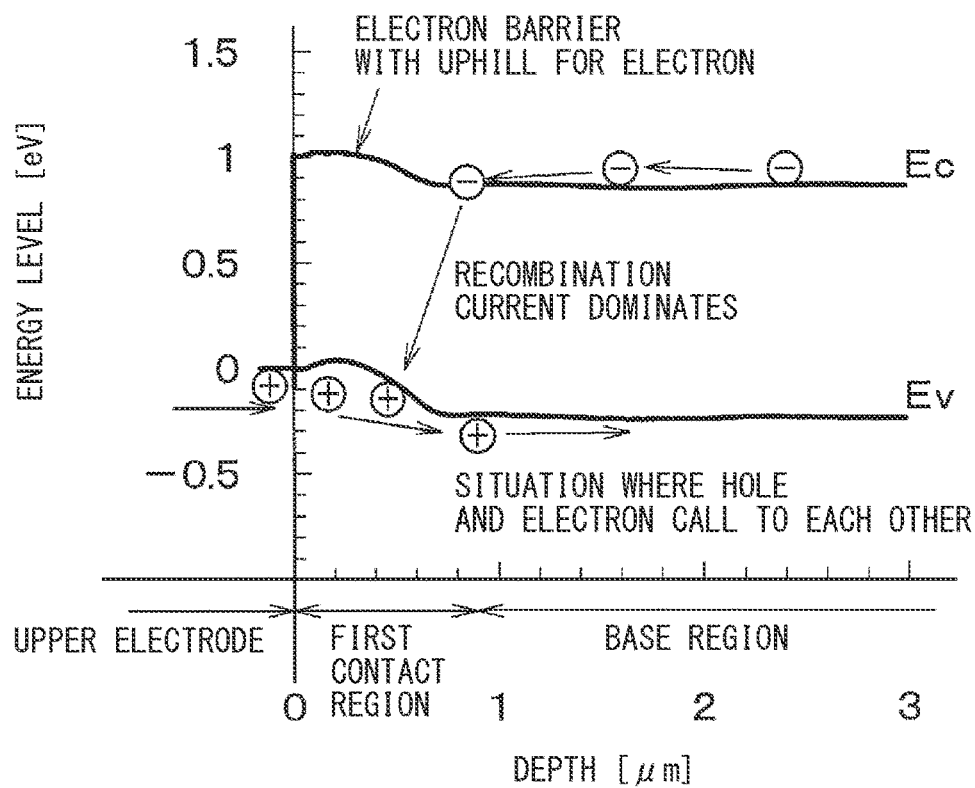
FIG. 3A illustrates an energy band diagram of a first contact region and an upper electrode.
Figure 3B:
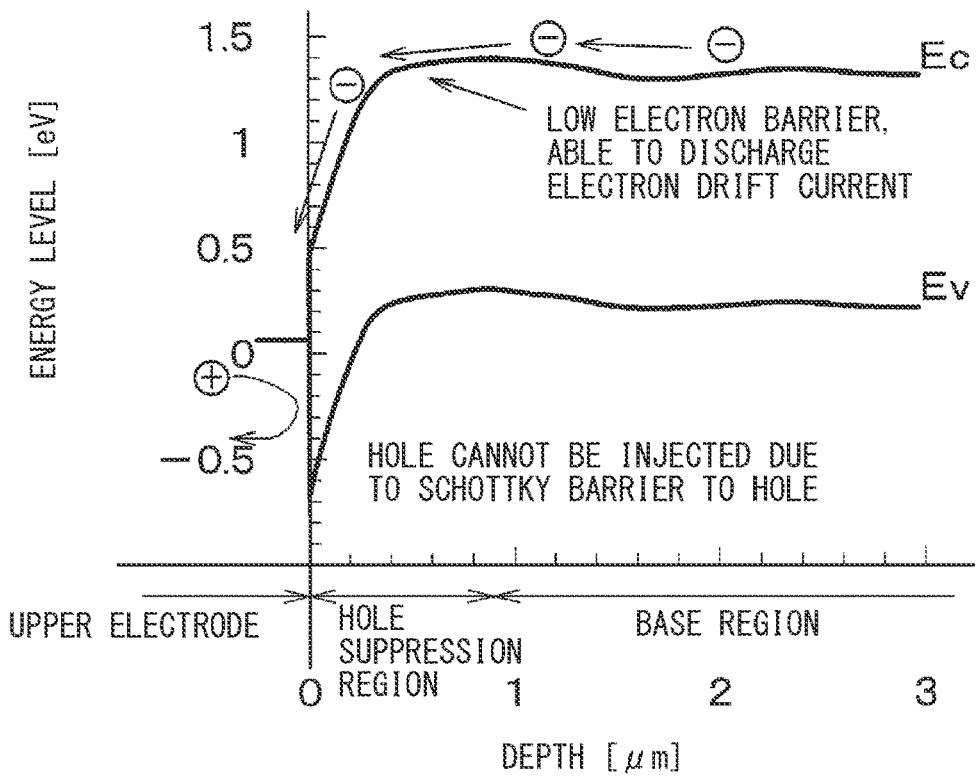
FIG. 3B illustrates an energy band diagram of a hole suppression region and an upper electrode.

As illustrated in FIG. 3A, as the electrons recombine with the holes between the first contact region 18a and the upper electrode 21, the holes can be injected to the first contact region 18a from the upper electrode 21. As illustrated in FIG. 3B, since the Schottky barrier junction is formed between the hole suppression region 19 and the upper electrode 21, the holes are hardly to be injected to the hole suppression region 19. Additionally, even though the electrons mixed into the base layer 12 in the IGBT region 1a from the cathode layer 24, the electrons are easily discharged to the upper electrode 21 as the drift current without selecting a recombination current with holes. FIGS. 3A, 3B respectively illustrate energy band diagrams with the forward voltage Vf between the cathode and the anode being about 2.5 V.

Figure 4A:
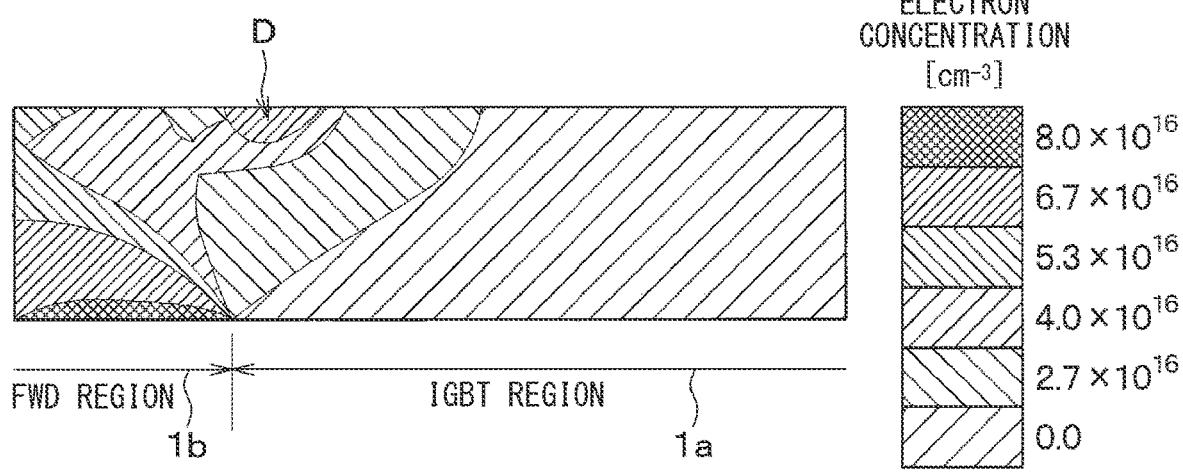
Figure 4B:
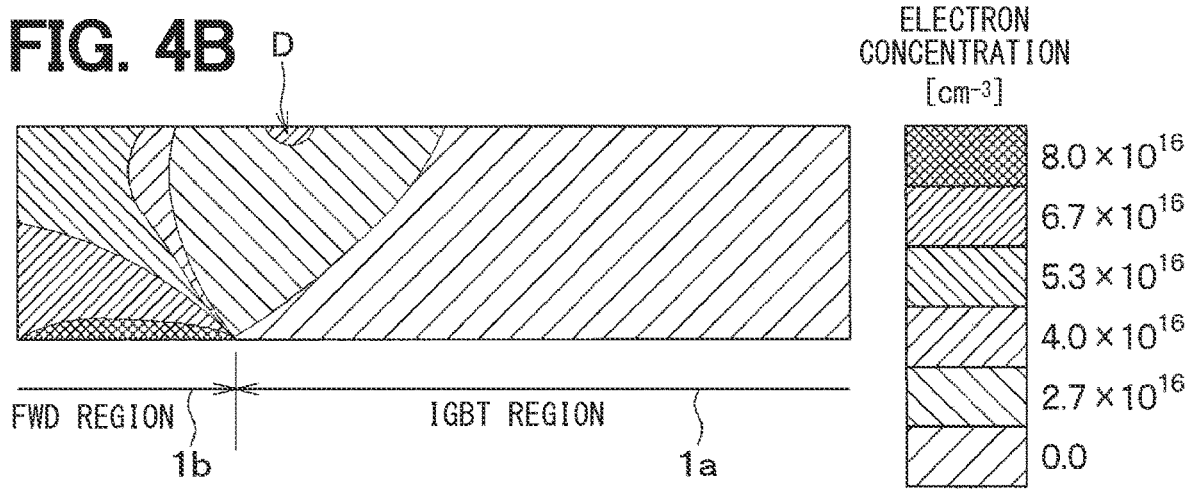
Figure 4C:
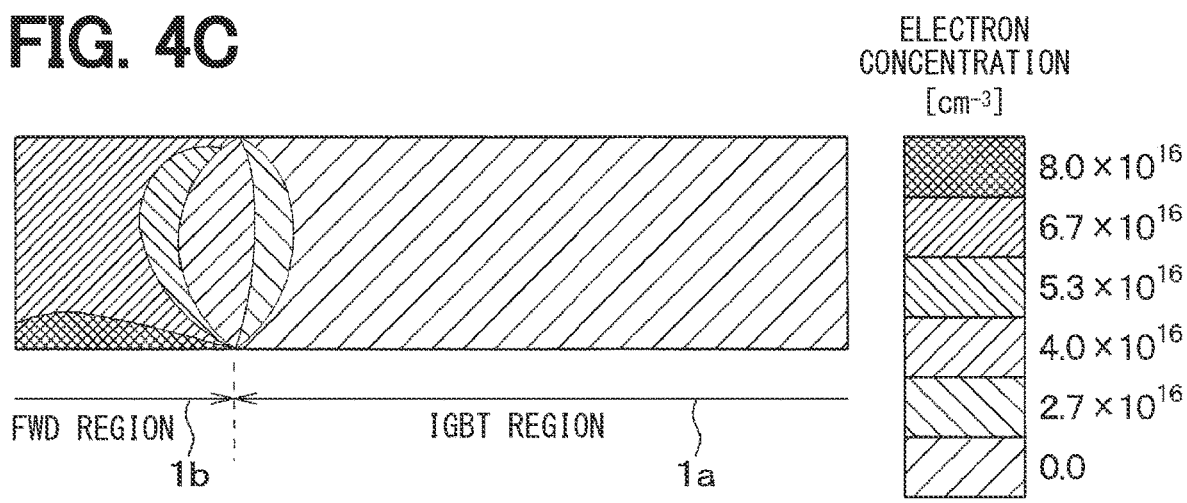

The inventors in the present application performed simulation related to carrier concentration distribution when the FWD element is in the ON-state, and acquired the results of electron concentration distribution respectively illustrated in FIGS. 4A to 4C. Since the FWD element is in the ON-state, there is a correspondence between the electron concentration and the hole concentration. The simulation results regarding the electron concentration distribution respectively illustrated in FIGS. 4A to 4C and the simulation results regarding the hole concentration distribution are substantially identical. Therefore, in the following, the carrier concentration distribution will be represented by the electron concentration distribution. In the following, the respective lengths of the emitter region 17, the first contact region 18a, and the hole suppression region 19 along the extending direction of the trench 14 are described. As illustrated in FIG. 2, the length of the emitter region 17 is described as length L1, and the length of the hole suppression region 19 is described as length L2.

As illustrated in FIG. 4A, in a case where the hole suppression region 19 is not formed, it is confirmed that the region D with higher electron concentration at the surface layer portion at a side closer to the FWD region 1b is present in the IGBT region 1a. In other words, in a case where the hole suppression region 19 is not formed, it is confirmed that the region with a higher hole concentration at the surface layer portion at a side closer to the FWD region 1b is present in the IGBT region 1a. As illustrated in FIG. 4B, in a case where the hole suppression region 19 is formed, it is confirmed that the region D becomes smaller in the IGBT region 1a. As illustrated in FIG. 4C, in a case where the length of the hole suppression region 19 is set to an ultimate level, it is confirmed that the region D does not appear at the surface layer portion at a side closer to the FWD region 1b in the IGBT region 1a.

Setting the length L2 of the hole suppression region 19 in the simulation shown in FIG. 4C to an ultimate level means that the length of the first contact region 18a is set to zero. Therefore, the first contact region 18a is not included in the structure. In other words, when the length L2 of the hole suppression region 19 in the simulation shown in FIG. 4C is set to the ultimate level, only the emitter region 17 and the hole suppression region 19 are alternately arranged in the lengthwise direction of the trench 14. The same is also applied to a case where the length L2 of the hole suppression region 19 described in the following is set to the ultimate level.

Figure 5:
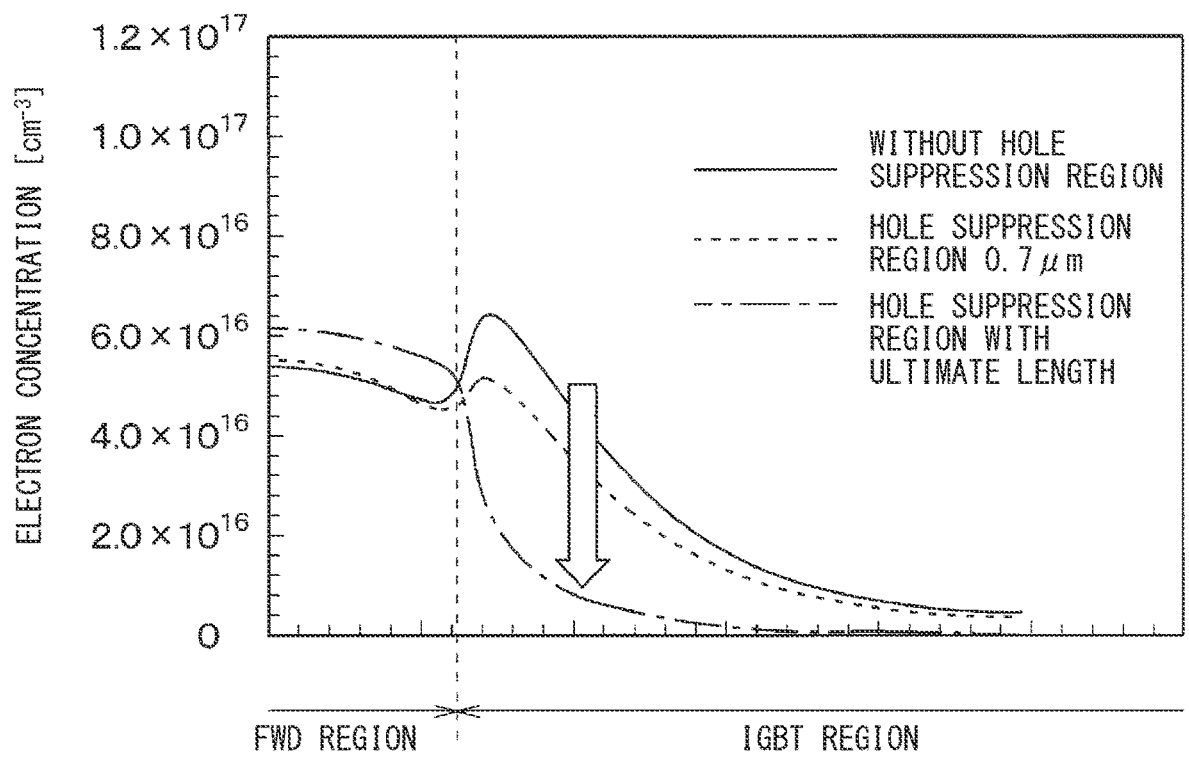

As illustrated in FIG. 5, it is confirmed that the electron concentration, in other words, the hole concentration becomes lower with the formation of the hole suppression region 19 in the IGBT region 1a, as compared with a case without the formation of the hole suppression region 19. Additionally, it is confirmed that the electron concentration, in other words, the hole concentration becomes lower since it is difficult to inject the holes as the length L2 of the hole suppression region 19 is set to be longer. FIG. 5 illustrates the result of the electron concentration at the portion of the semiconductor substrate 10 with the depth of 10 μm from the first surface 10a, and illustrates the result of the electron concentration of the portion of the drift layer 11 at a side closer to the lower electrode 25 than the portion at which the trench 14 arrives.

Thereafter, when the FWD element 4a is switched from the ON-state to the OFF-state, a reverse voltage is applied to the lower electrode 25 to apply a voltage higher than that of the upper electrode 21. In other words, when a current is cut off from a state in which a forward current flows in the FWD element, a reverse voltage is applied to the lower electrode 25 so as to apply a voltage higher than the voltage applied to the upper electrode 21. As a result, the FWD element turns to the recovery state. The holes in the base layer 12 are attracted to the upper electrode 21 and electrons in the drift layer 11 are attracted to the lower electrode 25. Therefore, a recovery current is generated.

At this time, in the IGBT region 1a, the injection of the holes is suppressed when the FWD element is in the ON-state. Therefore, in the semiconductor device according to the present embodiment, it is possible to reduce the recovery current and reduce the recovery loss Err.

Figure 6A:
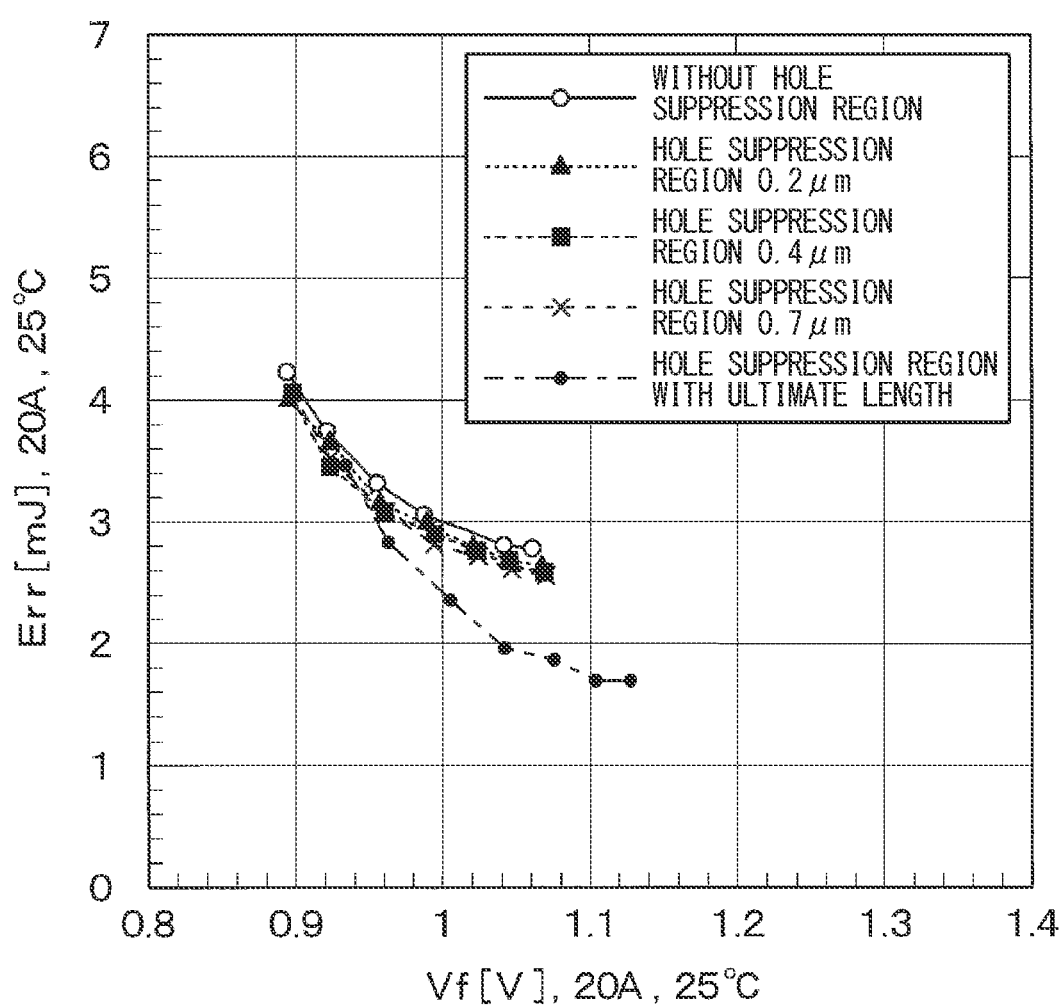
FIG. 6A illustrates a simulation result related to recovery loss at 25 degrees Celsius.
Figure 6B:
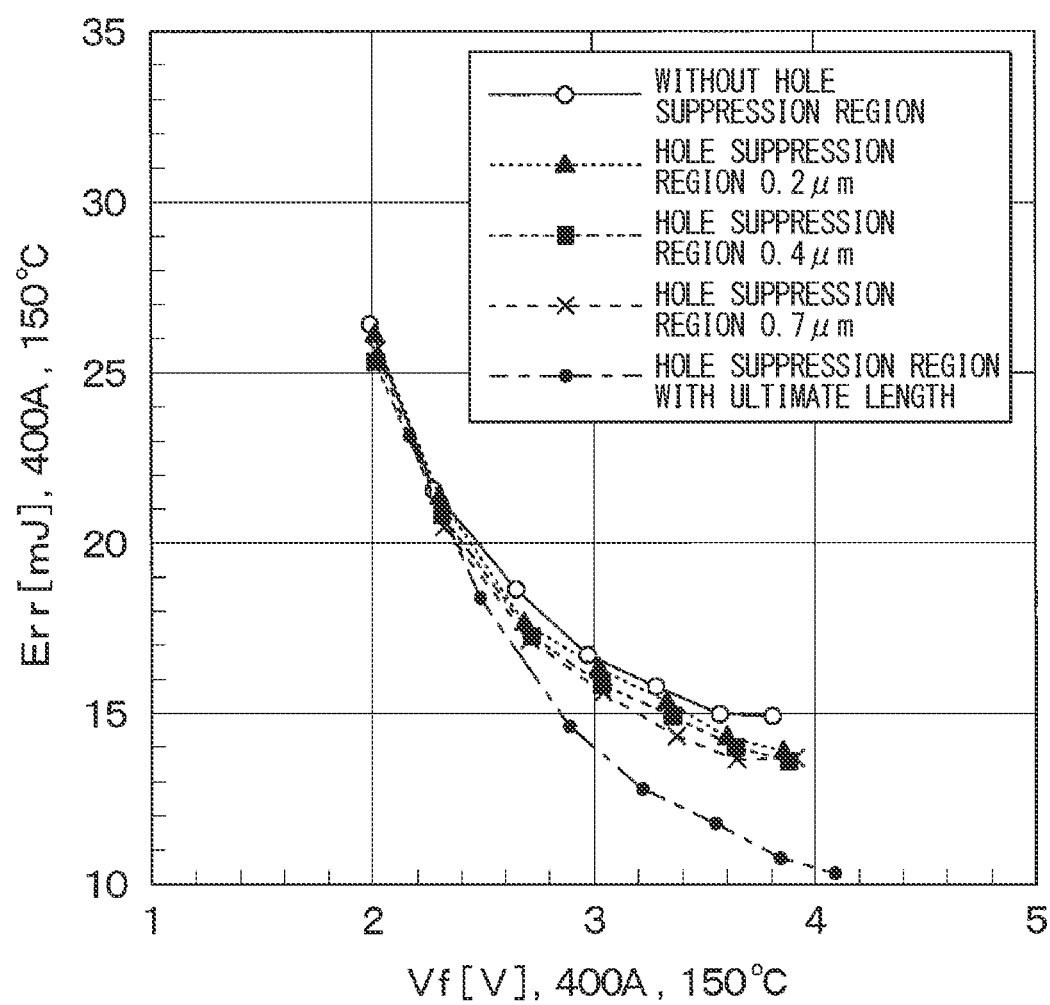
FIG. 6B illustrates a simulation result related to the recovery loss at 150 degrees Celsius.

As illustrated in FIGS. 6A, 6B, it is possible to reduce the recovery loss Err with the formation of the hole suppression region 19. Since the injection of the holes is suppressed as the length L2 of the hole suppression region 19 is set to be longer, the recovery loss Err becomes smaller as the length L2 of the hole suppression region 19 is set to be longer.

It is possible to reduce the recovery loss Er with the formation of the hole suppression region 19 in the semiconductor device according to the present embodiment. However, the IGBT element in the semiconductor device may be latched up with the formation of the hole suppression region 19.

For this reason, in the present embodiment, the hole suppression region 19 is formed to be separated from the emitter region 17. As a result, it is possible to suppress the flow of the holes from the hole suppression region 19 to the emitter region 17 and further suppress the generation of latch-up, as compared with a case in which the hole suppression region 19 is formed to be in contact with the emitter region 17.

Figure 7:
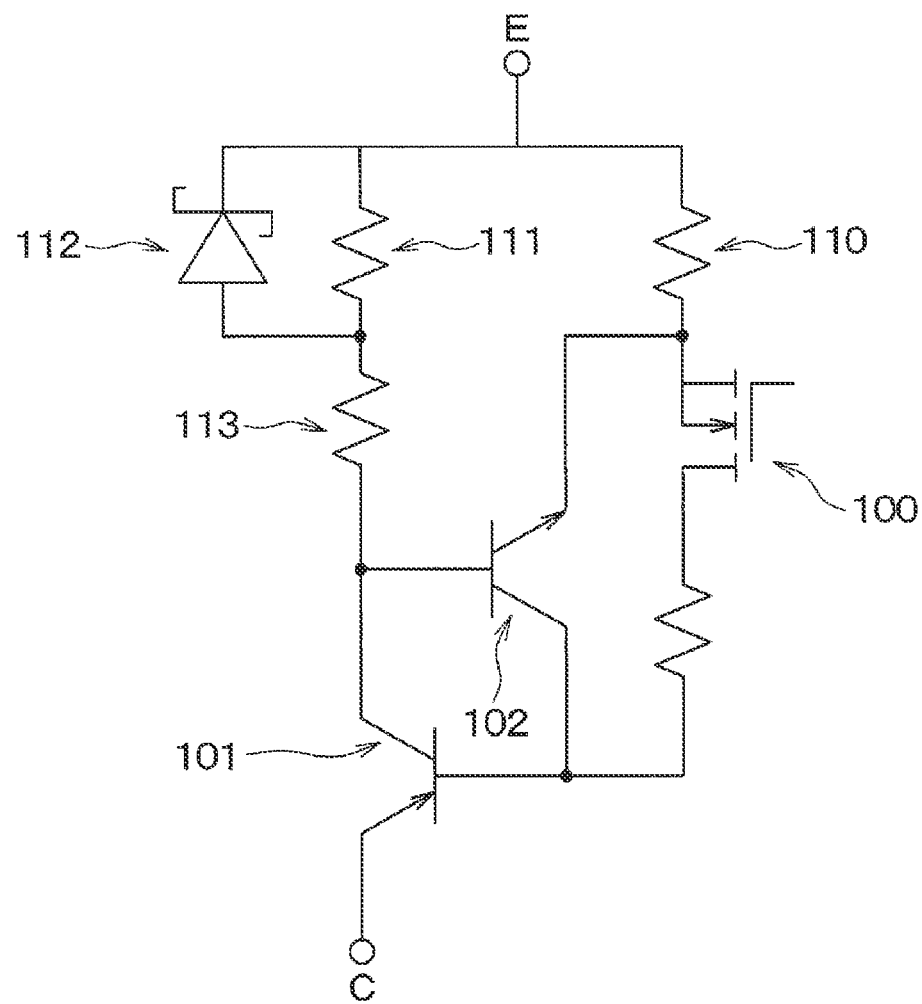
FIG. 7 is a circuit diagram of an IGBT element in the first embodiment.

In the present embodiment, the hole suppression region 19 has a structure as described in the following. The IGBT element in the semiconductor device is shown by an equivalent circuit in FIG. 7. FIG. 7 omits the illustration of the CS layer 13 for better understanding.

As illustrated in FIG. 7, the IGBT element includes a PNP transistor 101 and a parasitic NPN transistor 102 (hereinafter simply referred to as a parasitic transistor 102). The latch-up occurs as the parasitic transistor 102 operates. The parasitic transistor 102 includes the emitter region 17, the base layer 12 and the drift layer 11.

In the IGBT element, an emitter resistor 110 as an internal resistor in the emitter region 17, a contact resistor 111 as an internal resistor in the first contact region 18a, and a Schottky barrier diode (SBD) 112 are connected in parallel to the emitter E. The emitter E is the upper electrode 21, and the SBD 112 includes the hole suppression region 19 and the upper electrode 21. The contact resistor 111 and the anode of the SBD 112 are connected to the base of the parasitic transistor 102 through a base resistor 113 as an internal resistor of the base layer 12.

In this case, when the potential of the base resistor 113 at a side closer to the contact resistor 111 is low, the operation of the parasitic transistor 102 is inhibited. However, when the SBD 112 is formed by forming the hole suppression region 19, the potential of the base resistor 113 at a side closer to the contact resistor 111 becomes higher. The potential of the base resistor 113 at a side closer to the contact resistor 111 becomes higher as the length L2 of the hole suppression region 19 is set to be longer to shorten the length of the first contact region 18a. When the potential of the base resistor 113 at a side closer to the contact resistor 111 becomes excessively higher, the latch-up which cannot be controlled by an N-type metal-oxide semiconductor (NMOS) 100 occurs with the operation of the parasitic transistor 102.

The difference between the hole quasi Fermi level $E_{fp}$ of the base layer 12 and the electron quasi Fermi level $E_{fn}$ of the emitter region 17 is equal to the base-emitter voltage $V_{BE}$ of the parasitic transistor 102. If there is no difference between the hole quasi Fermi level $E_{fp}$ and the electron quasi Fermi level $E_{fn}$, the base-emitter voltage $V_{BE}$ is equal to zero. Therefore, the base current with the holes does not flow so that the parasitic transistor 102 does not operate. Therefore, latch-up does not occur.

However, the parasitic transistor 102 operates when there is a difference between the hole quasi Fermi level $E_{fp}$ and the electron quasi Fermi level $E_{fn}$ and the base-emitter voltage $V_{BE}$ becomes larger. In this case, the latch-up which cannot be controlled by the NMOS 100 occurs.

Figure 8:
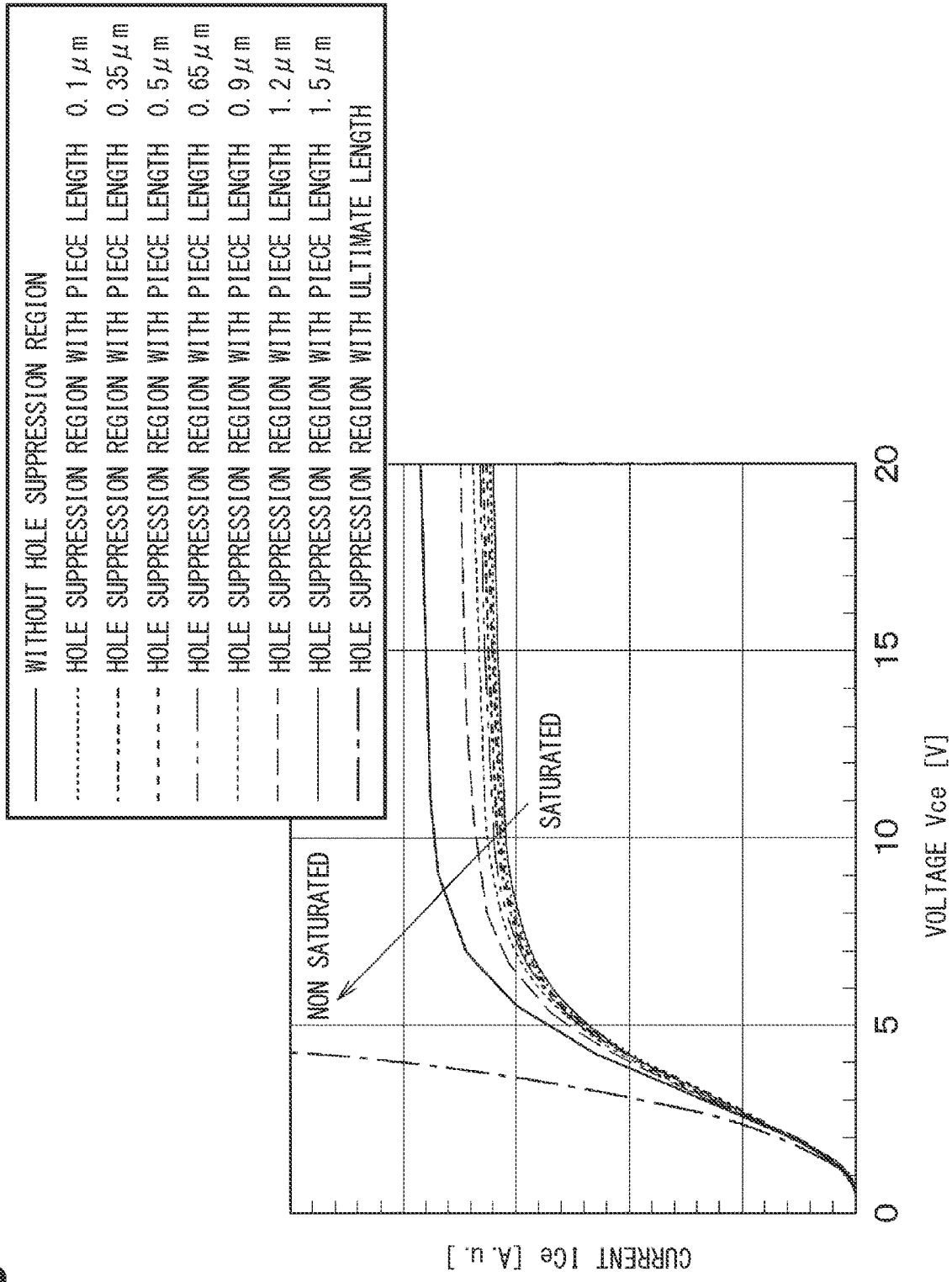
FIG. 8 illustrates a simulation result regarding a relationship between the length of the hole suppression region and a collector current.
Figure 9:
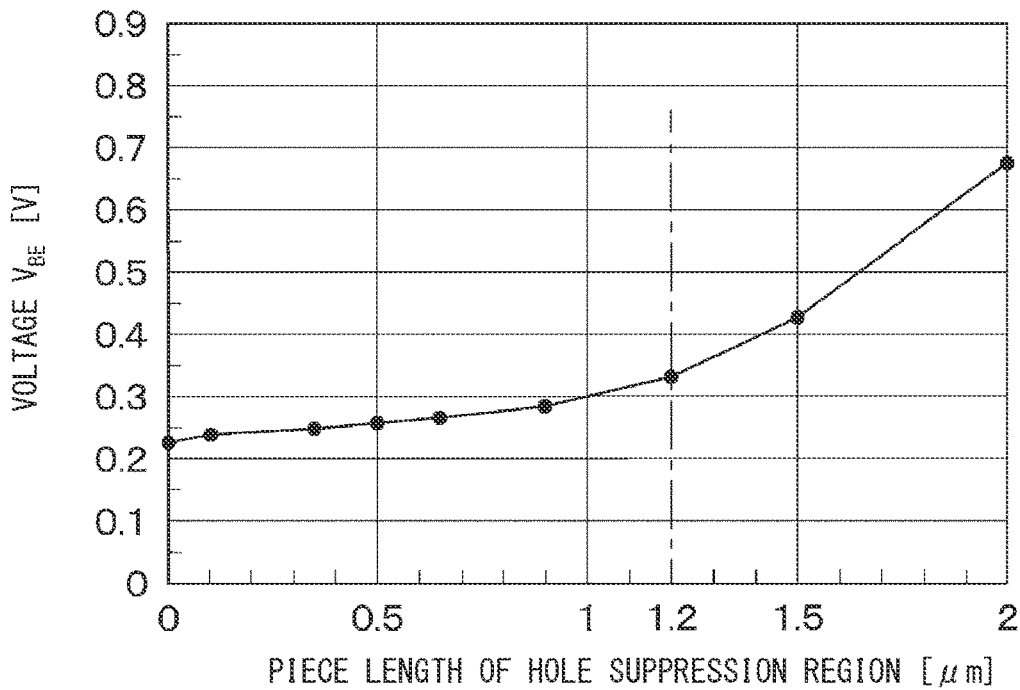
FIG. 9 illustrates a simulation result related to the relationship between the length of the hole suppression region and a base-emitter voltage of the parasitic NPN transistor.

Therefore, the inventors in the present application had a review on the length L2 of the hole suppression region 19 and acquired the results respectively shown in FIGS. 8, 9. In FIGS. 8, 9, as illustrated in FIG. 2, the distance L between the respective centers of the adjacent emitter regions 17, in other words, the pitch distance, in the extending direction of the trench 14 is set to 6 μm, and the length of each emitter region 17 is set to 1.2 μm. FIGS. 8, 9 respectively illustrate simulation results when the pitch distance is fixed and the length L2 of the hole suppression region 19 is changed. In other words, FIGS. 8, 9 respectively illustrate simulation results when the sum of the length of the first contact region 18a and the length of the hole suppression region 19 is 3.6 μm and the ratio of the length of the hole suppression region 19 to the length of the first contact region 18a, in other words, the ratio of areas. However, in FIGS. 8, 9, a half of the length L2 of the hole suppression region 19 is illustrated as a piece length. For example, when the piece length of the hole suppression region 19 in FIG. 8 is 0.1 μm, the length L2 of the hole suppression region 19 is 0.2 μm.

As illustrated in FIG. 8, in a case where the hole suppression region 19 is not formed, the collector current $I_{ce}$ at the time in which the IGBT element is turned to the ON-state becomes constant, in other words, a saturation current, as the collector-emitter voltage $V_{ce}$ becomes a constant voltage. In a case where the hole suppression region 19 is formed, the collector current $I_{ce}$ is likely to be latched up as the piece length (in other words, the length L2) of the hole suppression region 19 becomes longer, and the saturation current becomes larger. However, in a case where the length L2 of the hole suppression region 19 is set to the ultimate level, the collector current $I_{ce}$ becomes linear without being saturated due to the occurrence of the latch-up. FIG. 8 illustrates a simulation result when the gate-emitter voltage $V_{ge}$ is 15 V.

As illustrated in FIG. 9, it is confirmed that the base-emitter voltage $V_{BE}$ of the parasitic transistor 102 sharply rises when the piece length of the hole suppression region 19 is 1.2 μm or longer. In other words, it is confirmed that the base-emitter voltage $V_{BE}$ of the parasitic transistor 102 sharply rises when the length L2 of the hole suppression region 19 is 2.4 μm or longer. In the present embodiment, the sum of the length of the first contact region 18a and the length of the hole suppression region 19 is 3.6 μm. For this reason, when the ratio of the area (in other words, the length)

of the first contact region 18a to the area (in other words, the length) of the hole suppression region 19 is 1:2 or larger, the base-emitter voltage $V_{BE}$ of the parasitic transistor 102 tends to rise. That is, the latch-up easily occurs due to the parasitic transistor 102. In the present embodiment, the ratio of the area of the first contact region 18a to the area of the hole suppression region 19 is 1:2 or smaller. In other words, the area of the hole suppression region 19 is less than twice the area of the first contact region 18a. As a result, in the semiconductor device of the present embodiment, it is possible to suppress the occurrence of latch-up even though the hole suppression region 19 is formed. FIG. 9 illustrates the simulation result when a large current of 2000 A flows.

The above description is the operation of the semiconductor device in this embodiment.

Figure 10:
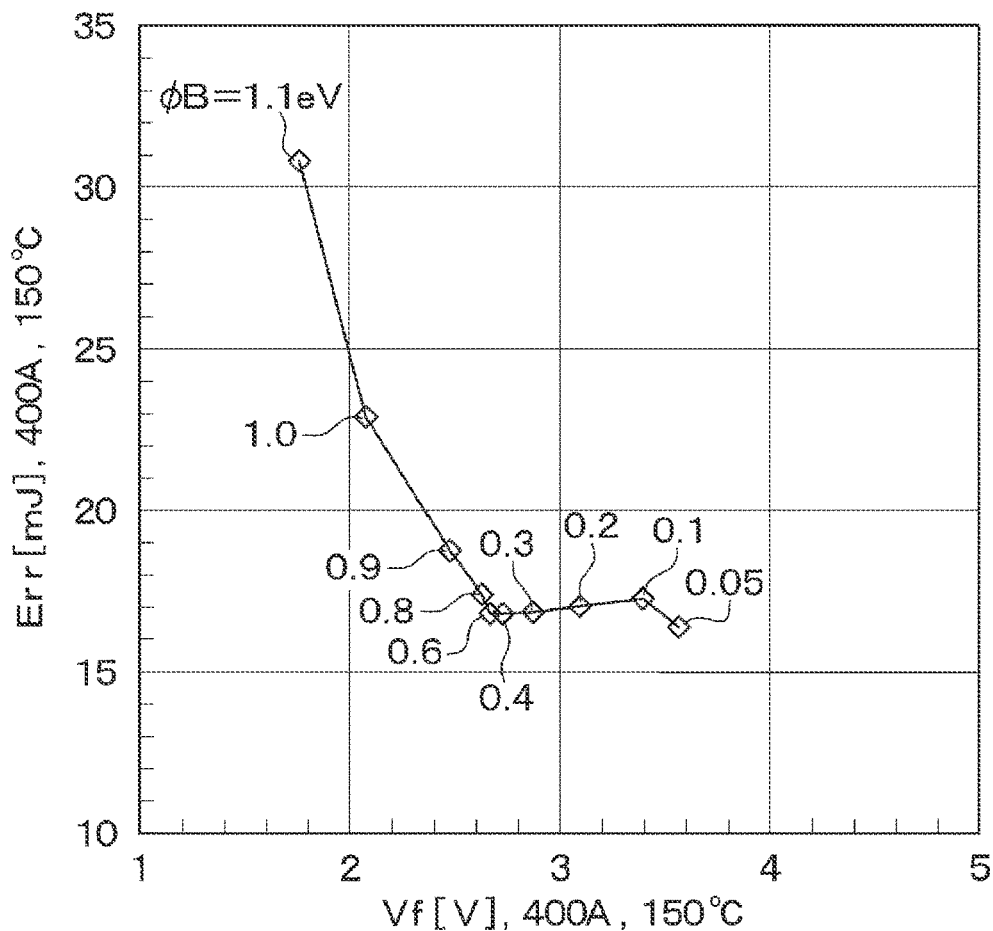
FIG. 10 illustrates a simulation result related to the relationship between the height of the Schottky barrier of the upper electrode and the recovery loss.

In the present embodiment, the Schottky barrier height TB of the upper electrode 21 is further defined with reference to FIG. 10. FIG. 10 illustrates a simulation result when the impurity concentration in the hole suppression region 19 is $1.0 \times 10^{17}$ cm$^{-3}$.

As illustrated in FIG. 10, the recovery loss Err tends to increase, because the holes are more likely to be injected as the Schottky barrier height of the upper electrode 21 increases. The recovery loss Err sharply increases when the Schottky barrier height TB becomes larger than 0.8 eV when the impurity concentration in the hole suppression region 19 is $1.0 \times 10^{17}$ cm$^{-3}$. Therefore, the upper electrode 21 according to the present embodiment is made of material having the Schottky barrier height being less than or equal to 0.8 eV. For example, the material is made of titanium silicide.

In the present embodiment, the hole suppression region 19 exposed from the first surface 10a of the semiconductor substrate 10 is formed, and the upper electrode 21 has Schottky barrier junction with the hole suppression region 19. When the FWD element is in the ON-state, it is possible to suppress the injection of the holes to the surface layer portion of the IGBT region 1a. Thus, it is possible to reduce the recovery current, and it is possible to reduce the recovery loss Err.

The hole suppression region 19 is exposed from the first surface 10a of the semiconductor substrate 10. For this reason, it is not required to form the trench contact for connecting the hole suppression region 19 and the upper electrode 21. Therefore, it is possible to narrow the distance between the adjacent trenches, and it is possible to suppress the rise in the on-state voltage of the IGBT element.

The emitter region 17 and the first contact region 18a are formed in the lengthwise direction of the trench 14. Therefore, it is possible to further narrow the distance between the adjacent trenches 14, as compared with a case in which the emitter region 17 and the first contact region 18a are formed in a direction perpendicular to the lengthwise direction of the trench 14.

The hole suppression region 19 is formed as not to be in contact with the emitter region 17. Therefore, it is possible to suppress the occurrence of the latch-up of the IGBT element, as compared with a case in which the hole suppression region 19 is in contact with the emitter region 17.

The ratio of the area of the first contact region 18a to the area of the hole suppression region 19 is 1:2 or smaller. Therefore, it is possible to further suppress the occurrence of the latch-up of the IGBT element.

In the present embodiment, the CS layer 13 is formed. Therefore, when the IGBT element is in the ON-state, the holes supplied to the drift layer 11 are suppressed from coming out of the upper electrode 21 through the CS layer 13 to reduce the on-state voltage.

In the present embodiment, the base layer 12 includes the lower base layer 12a, the first upper base layer 12b and the second upper base layer 12c. The impurity concentration of the lower base layer 12a is set based on the required breakdown voltage. The impurity concentration of the first upper base layer 12b is set based on the required threshold voltage Vth in the insulated gate structure. The impurity concentration of the second upper base layer 12c is set based on the forward voltage Vf when the required FWD element is in the ON-state. Thus, it is possible to enhance the properties of the semiconductor device by setting the impurity concentration for each of the lower base layer 12a, the first upper base layer 12b and the second upper base layer 12c to satisfy the required conditions.

Second Embodiment

The following describes a second embodiment. In contrast to the first embodiment, the present embodiment does not include the CS layer 13. The other parts are the same as those of the first embodiment, and therefore a description of the same parts will be omitted below.

Figure 11:
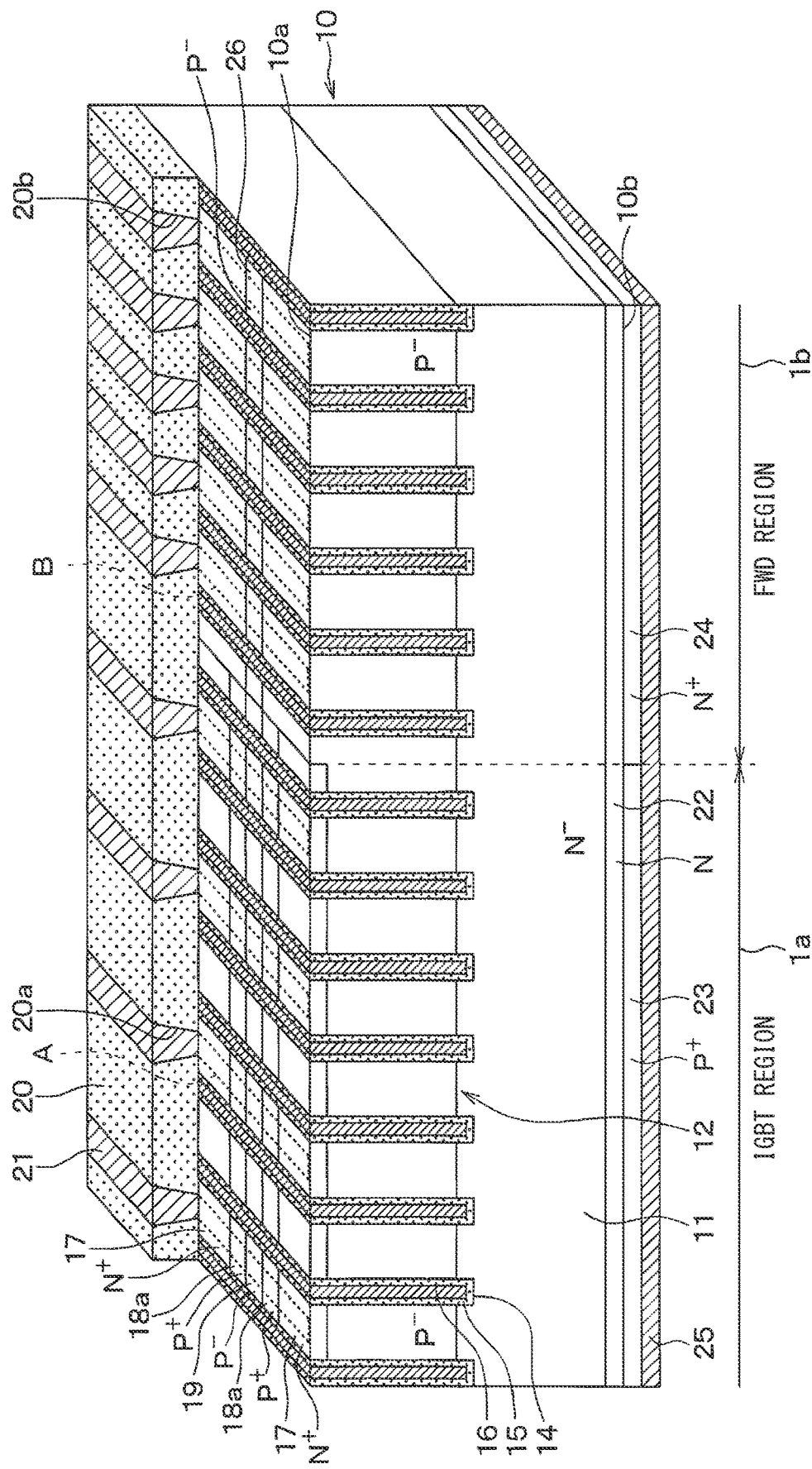
FIG. 11 illustrates a perspective cross-sectional view of a semiconductor device according to a second embodiment.

As illustrated in FIG. 11, in the present embodiment, the CS layer 13 is not formed at the semiconductor substrate 10, and the base layer 12 is not divided in the depth direction. The base layer 12 has a constant impurity concentration in the IGBT region 1a and the FWD region 1b. In such a structure, the forward voltage Vf of the FWD element may be adjusted by forming a P$^-$-type adjustment region 26 that has a lower impurity concentration than the base layer 12.

Even in such a semiconductor device, it is possible to attain the advantageous effect identical to the one in the first embodiment by forming the hole suppression region 19 at the IGBT region 1a.

Third Embodiment

The following describes a third embodiment. The present embodiment is different from the first embodiment in a portion where the hole suppression region 19 is formed. The other parts are the same as those of the first embodiment, and therefore a description of the same parts will be omitted below.

Figure 12:
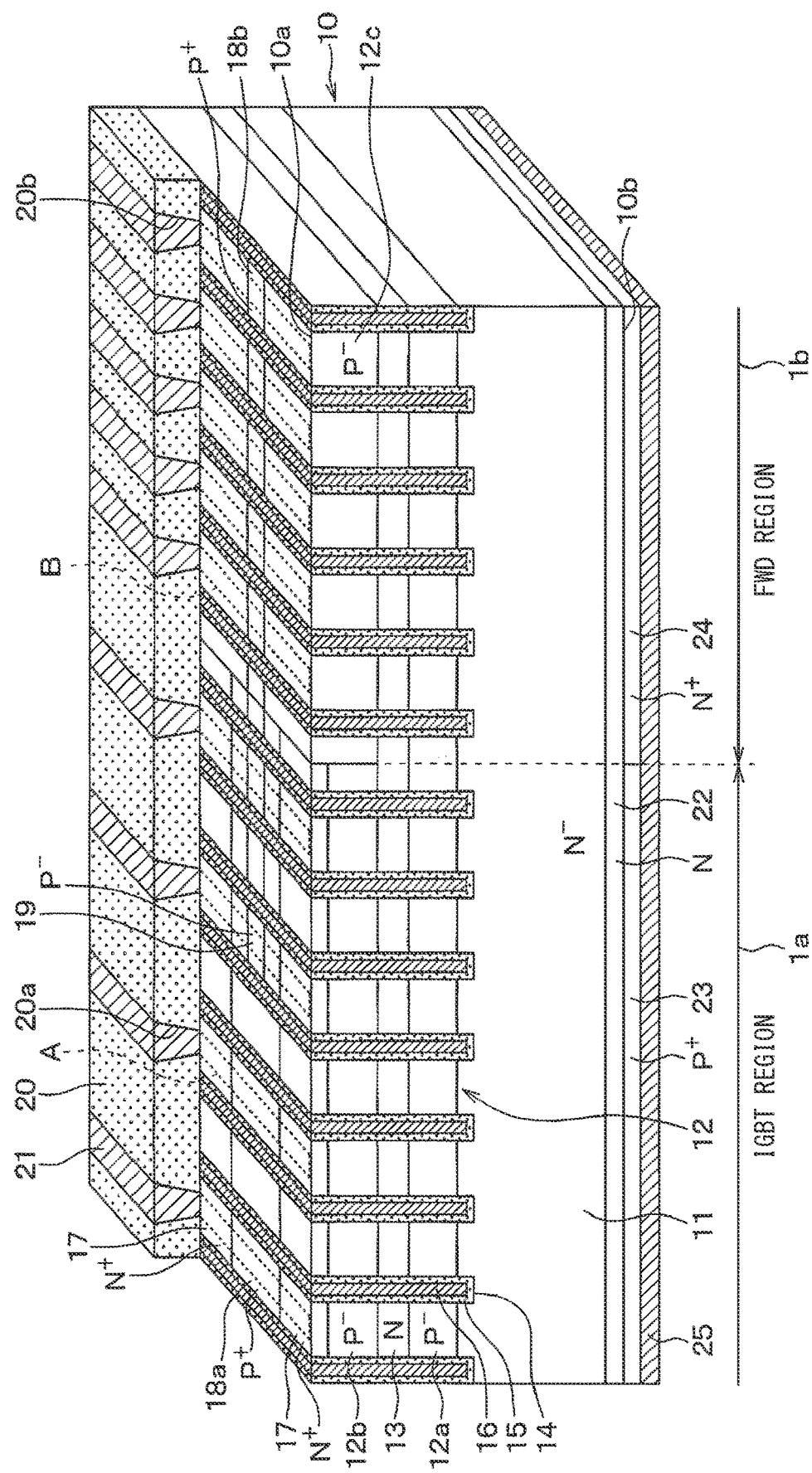
FIG. 12 illustrates a perspective cross-sectional view of a semiconductor device according to a third embodiment.

In the present embodiment, as illustrated in FIG. 12, the hole suppression region 19 is only formed at a location of the IGBT region 1a closer to a boundary portion between the FWD region 1b and the IGBT region 1a. In other words, the hole suppression region 19 is not formed at a portion located at a side facing the FWD region 1b with the boundary portion interposed between the IGBT region 1a and the FWD region 1b. For example, in a case where the IGBT region 1a and the FWD region 1b are alternately aligned, the hole suppression region 19 is not formed at an inner edge portion of the IGBT region 1a in the aligned direction of the IGBT region 1a and the FWD region 1b.

In such a semiconductor device, the hole suppression region 19 is arranged only at a portion of the IGBT region 1a that is likely to affect the recovery loss Err. Therefore, it is possible to suppress a decrease in the latch-up resistance while reducing the recovery loss Err.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various combinations and configurations, which are preferred, other combinations and configurations, including more, less or only a single element, are also within the spirit and scope of the present disclosure.

For example, in each of the above embodiments, the first conductivity type may be P-type, and the second conductivity type may be N-type.

In each of the above embodiments, the configuration of the IGBT region 1a and the configuration of the FWD region 1b may be appropriately modified. For example, in the first embodiment, in the IGBT region 1a, the lower base layer 12a and the second upper base layer 12c may have the same impurity concentration. Similarly, in the FWD region 1b, the lower base layer 12a and the second upper base layer 12c may have the same impurity concentration. In a case where the lower base layer 12a and the second upper base layer 12c have the same impurity concentration in the FWD region 1b, the forward voltage Vf of the FWD element may be adjusted by forming the $P^-$-type adjustment region 26 having a lower impurity concentration than the base layer 12.

In each of the above embodiments, the hole suppression region 19 may have a structure different from the first upper base layer 12b, and may have an impurity concentration different from the first upper base layer 12b.

In each of the above embodiments, in the IGBT region 1a, the first contact hole 20a may be formed at the interlayer insulation film 20 so as to expose the portion between the adjacent trenches 14. That is, the IGBT region 1a according to the present embodiment may not have to be a thinning structure.

In each of the above embodiments, the emitter region 17 and the first contact region 18a may be formed in an order in a direction perpendicular to the lengthwise direction of the trench 14. The hole suppression region 19 may be in contact with the emitter region 17. Even with such a structure, it is possible to reduce the recovery loss Err with the formation of the hole suppression region 19.

The present disclosure has been described based on examples, but it is understood that the present disclosure is not limited to the examples or structures. The present disclosure encompasses various modifications and variations within the scope of equivalents. In addition, various combinations and configurations, as well as other combinations and configurations that include only one element, more, or less, fall within the scope and spirit of the present disclosure.

What is claimed is:

1. A semiconductor device comprising:
a semiconductor substrate shared by an insulated gate bipolar transistor (IGBT) region with an IGBT element and a freewheeling diode (FWD) region with an FWD element, the semiconductor substrate including
a drift layer of a first conductivity type,
a base layer of a second conductivity type disposed on the drift layer,
a collector layer of the second conductivity type disposed at an opposite side of the drift layer from the base layer in the IGBT region, and
a cathode layer of the first conductivity type disposed at the opposite side of the drift layer from the base layer in the FWD region;
a plurality of trenches penetrating the base layer to reach the drift layer, each of the trenches having a lengthwise direction and extending in the lengthwise direction;
a gate insulation film disposed at a wall surface of each of the trenches in the IGBT region;
a gate electrode disposed on the gate insulation film;
an emitter region of the first conductivity type as a surface layer portion of the base layer that is in contact with each of the trenches in the IGBT region, the emitter region having a higher impurity concentration than the drift layer;
a contact region of the second conductivity type disposed at the surface layer portion of the base layer in the IGBT region, the contact region having a higher impurity concentration than the base layer;
a first electrode disposed at a first surface of the semiconductor substrate at a side closer to the base layer, the first electrode electrically connected to the base layer and the emitter region;
a second electrode disposed at a second surface of the semiconductor substrate at a side closer to the collector layer and the cathode layer, the second electrode electrically connected to the collector layer and the cathode layer; and
a carrier suppression region of the second conductivity type exposed from the first surface of the substrate in the IGBT region, the carrier suppression region having a lower impurity concentration than the contact region,
wherein the first electrode has a Schottky barrier junction with the carrier suppression region.

2. The semiconductor device according to claim 1,
wherein the base layer is divided into a lower base layer and an upper base layer by a carrier storage layer in the IGBT region,
wherein the lower base layer is at a side closer to the drift layer, and the upper base layer is at a side closer to the first surface of the semiconductor substrate,
wherein the carrier storage layer has a higher impurity concentration than the drift layer, and
wherein an impurity concentration of the lower base layer is different from an impurity concentration of the upper base layer.

3. The semiconductor device according to claim 1,
wherein the emitter region and the contact region are alternately disposed along the lengthwise direction of each of the trenches in the IGBT region.

4. The semiconductor device according to claim 3,
wherein the carrier suppression region is disposed inside the contact region, and is separated from the emitter region.

5. The semiconductor device according to claim 4,
wherein a ratio of an area of the contact region to an area of the carrier suppression region is equal to or smaller than 1 to 2.

* * * * *